(12) United States Patent
Ueta et al.

(10) Patent No.: US 11,080,156 B2
(45) Date of Patent: Aug. 3, 2021

(54) ELECTRONIC CONTROLLER AND CONTROL METHOD THEREOF, AND ELECTRONIC CONTROL SYSTEM

(71) Applicant: Hitachi Automotive Systems, Ltd., Hitachinaka (JP)

(72) Inventors: Taisuke Ueta, Tokyo (JP); Satoshi Tsutsumi, Tokyo (JP); Hideki Endo, Tokyo (JP); Hideyuki Sakamoto, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 159 days.

(21) Appl. No.: 16/488,290

(22) PCT Filed: Jan. 12, 2018

(86) PCT No.: PCT/JP2018/000714
§ 371 (c)(1),
(2) Date: Aug. 23, 2019

(87) PCT Pub. No.: WO2018/179677
PCT Pub. Date: Oct. 4, 2018

(65) Prior Publication Data
US 2019/0377552 A1   Dec. 12, 2019

(30) Foreign Application Priority Data

Mar. 28, 2017 (JP) .............. JP2017-063644

(51) Int. Cl.
*G01R 31/28* (2006.01)
*G06F 11/22* (2006.01)
(Continued)

(52) U.S. Cl.
CPC ............ *G06F 11/22* (2013.01); *G01R 31/317* (2013.01); *G01R 31/318516* (2013.01);
(Continued)

(58) Field of Classification Search
None
See application file for complete search history.

(56) References Cited

U.S. PATENT DOCUMENTS

| 8,957,701 | B2 | 2/2015 | Itoh |
| 2004/0170070 | A1 | 9/2004 | Rapp et al. |

(Continued)

FOREIGN PATENT DOCUMENTS

| GB | 2180382 A | 3/1987 |
| JP | 10-82839 A | 3/1998 |

(Continued)

OTHER PUBLICATIONS

International Search Report (PCT/ISA/210) issued in PCT Application No. PCT/JP2018/000714 dated Mar. 27, 2018 with English translation (four pages).

(Continued)

*Primary Examiner* — Guerrier Merant
(74) *Attorney, Agent, or Firm* — Crowell & Moring LLP

(57) ABSTRACT

An electronic controller includes: a logic circuit that is reconfigurable based on a reconfiguration instruction; an arithmetic unit that is configured in the logic circuit; a processing controller that transmits the reconfiguration instruction of the arithmetic unit to the logic circuit and that makes the reconfigured arithmetic unit execute predetermined operation; and a testing unit that executes an operation test for an arithmetic unit when the arithmetic unit is reconfigured, and that transmits the result of the operation test to the processing controller as a notice. Here, the processing controller makes the arithmetic unit execute predetermined processing based on the notice received from the testing unit.

13 Claims, 14 Drawing Sheets

(51) Int. Cl.
   *G06F 16/18*     (2019.01)
   *H03K 19/173*    (2006.01)
   *G01R 31/3185*   (2006.01)
   *G01R 31/317*    (2006.01)
   *G08G 1/0968*    (2006.01)
   *H03K 19/17764*  (2020.01)
   *G06F 15/78*     (2006.01)
   *G05D 1/00*      (2006.01)

(52) U.S. Cl.
   CPC .......... *G06F 15/78* (2013.01); *G06F 16/1805* (2019.01); *G08G 1/096805* (2013.01); *G08G 1/096811* (2013.01); *G08G 1/096816* (2013.01); *G08G 1/096822* (2013.01); *H03K 19/173* (2013.01); *H03K 19/17764* (2013.01); *G05D 1/0088* (2013.01)

(56) References Cited

U.S. PATENT DOCUMENTS

2009/0138770 A1   5/2009   Nakaya
2015/0127986 A1   5/2015   Tahara

FOREIGN PATENT DOCUMENTS

| JP | 2004-302727 A | 10/2004 |
| JP | 2006-518056 A |  8/2006 |
| JP | 2014-48125 A  |  3/2014 |

OTHER PUBLICATIONS

Japanese-language Written Opinion (PCT/ISA/237) issued in PCT Application No. PCT/JP2018/000714 dated Mar. 27, 2018 (five pages).

Extended European Search Report issued in European Application No. 18777252.0 dated Dec. 10, 2020 (10 pages).

FIG. 4

| NUMBER OF PROCESSING TIMES | PROCESSING INFORMATION 1 | PROCESSING INFORMATION 2 | PROCESSING INFORMATION 3 |
|---|---|---|---|
| 3 | CIRCUIT: A<br>TIME: T1 | CIRCUIT: B<br>TIME: T2 | CIRCUIT: C<br>TIME: T3 |

FIG. 5

| PROCESSING TIME | CIRCUIT TYPE | TEST RESULT | PROCESSING STATE |
|---|---|---|---|
| aa:aa:aa | A | OK | NORMAL |
| bb:bb:bb | B | NG | RETRY |
| cc:cc:cc | B | OK | NORMAL |
| dd:dd:dd | C | OK | NORMAL |
| ee:ee:ee | A | NG | ABNORMAL |
| ⋮ | ⋮ | ⋮ | ⋮ |
| 401 | 402 | 403 | 404 |

FIG. 6

| CIRCUIT TYPE | NUMBER OF TESTS | TEST PATTERN | TEST DATA 1 | TEST DATA 2 | TEST DATA 3 |
|---|---|---|---|---|---|
| A | 3 | RANDOM | TEST: A1in<br>EXPECTED: A1out | TEST: A2in<br>EXPECTED: A2out | TEST: A3in<br>EXPECTED: A3out |
| B | 1 | RANDOM | TEST: B1in<br>EXPECTED: B1out | TEST: B2in<br>EXPECTED: B2out | TEST: B3in<br>EXPECTED: B3out |
| C | 1 | FIXED | TEST: C1in<br>EXPECTED: C1out | — | — |

ELECTRONIC CONTROLLER AND CONTROL METHOD THEREOF, AND ELECTRONIC CONTROL SYSTEM

TECHNICAL FIELD

The present invention relates to an electronic controller, an electronic control system, and a control method of the electronic controller.

BACKGROUND ART

Engineering development aiming at automatic driving of a vehicle is proceeding. The automatic driving needs to recognize the surrounding environments and to control a vehicle, as substitute for a driver; accordingly, it requires a huge amount of information processing. In order to cope with the increasing information processing, study to employ a hardware chip in addition to a CPU is under way. The contents of information processing may be modified; accordingly, among the hardware chips, attention is directed to a PLD (Programmable Logic Device), such as an FPGA (Field Programmable Gate Array) that can be reconfigured. Patent Literature 1 discloses an LSI logic circuit evaluator performing self-diagnosis of each of multiple boards implemented with a field programmable gate array in which the operation of the digital circuit is determined by writing electrically circuit information in the device by a program and in which the circuit information is rewritable electrically. Here, each of the boards includes a coupling means that couples an output signal of the field programmable gate array to other boards according to an external instruction, and a replicating means that replicates the output signal of the field programmable gate array to the self-substrate according to the external instruction.

CITATION LIST

Patent Literature

Patent Literature 1: Japanese Unexamined Patent Application Publication No. 2004-302727

SUMMARY OF INVENTION

Technical Problem

The present inventors paid attention to the point that, by repeating the reconfiguration and the execution of operation in one logic circuit, it is possible to execute sequentially multiple different pieces of processing, without employing a large-scale logic circuit. Furthermore, the present inventors found out that an operation test is necessary after the reconfiguration because of a possible problem occurring in the reconfiguration. However, the invention described in Patent Literature 1 cannot perform the operation test of the reconfigured logic circuit.

Solution to Problem

An electronic controller according to a first aspect of the present invention includes: a logic circuit that is reconfigurable based on a reconfiguration instruction; an arithmetic unit configured in the logic circuit; a processing controller that transmits a reconfiguration instruction of the arithmetic unit to the logic circuit and that makes the reconfigured arithmetic unit execute a predetermined operation; and a testing unit that executes an operation test for the arithmetic unit when the arithmetic unit is reconfigured and that transmits the result of the operation test to the processing controller as a notice. Here, the processing controller makes the arithmetic unit execute the predetermined processing based on the notice received from the testing unit.

An electronic control system according to a second aspect of the present invention includes: an electronic controller described above; a communication unit that is wire-coupled to the electronic controller; and a server that performs wireless communicates with the communication unit. In the electronic control system, the electronic controller further includes a circuit memory unit that stores the circuit information, and the electronic controller makes the circuit memory unit store the circuit information received from the server via the wireless communication unit, and transmits the circuit information stored in the circuit memory unit to the logic circuit.

A control method of an electronic controller according to a third aspect is for an electronic controller provided with a logic circuit that is reconfigurable based on a reconfiguration instruction and a communication interface that receives sensor information acquired by a coupled sensor for every processing cycle. The control method of the electronic controller includes the steps of: reconfiguring an arithmetic unit in the logic circuit at least once for the every processing cycle; executing an operation test of the arithmetic unit when the arithmetic unit is reconfigured; and making the reconfigured arithmetic unit execute a predetermined processing with the use of the sensor information, based on the result of the operation test.

Advantageous Effects of Invention

According to the present invention, it is possible to confirm the normality of the reconfigured logic circuit whenever the logic circuit is reconfigured.

BRIEF DESCRIPTION OF DRAWINGS

FIG. 4 is a drawing illustrating an example of a processing information DB 3;

FIG. 5 is a drawing illustrating an example of a log DB 4;

FIG. 6 is a drawing illustrating an example of a test DB 5;

DESCRIPTION OF EMBODIMENTS

Embodiment

Hereinafter, an electronic control system according to First Embodiment is explained with reference to FIG. 1-FIG. 11.

Figure 1:
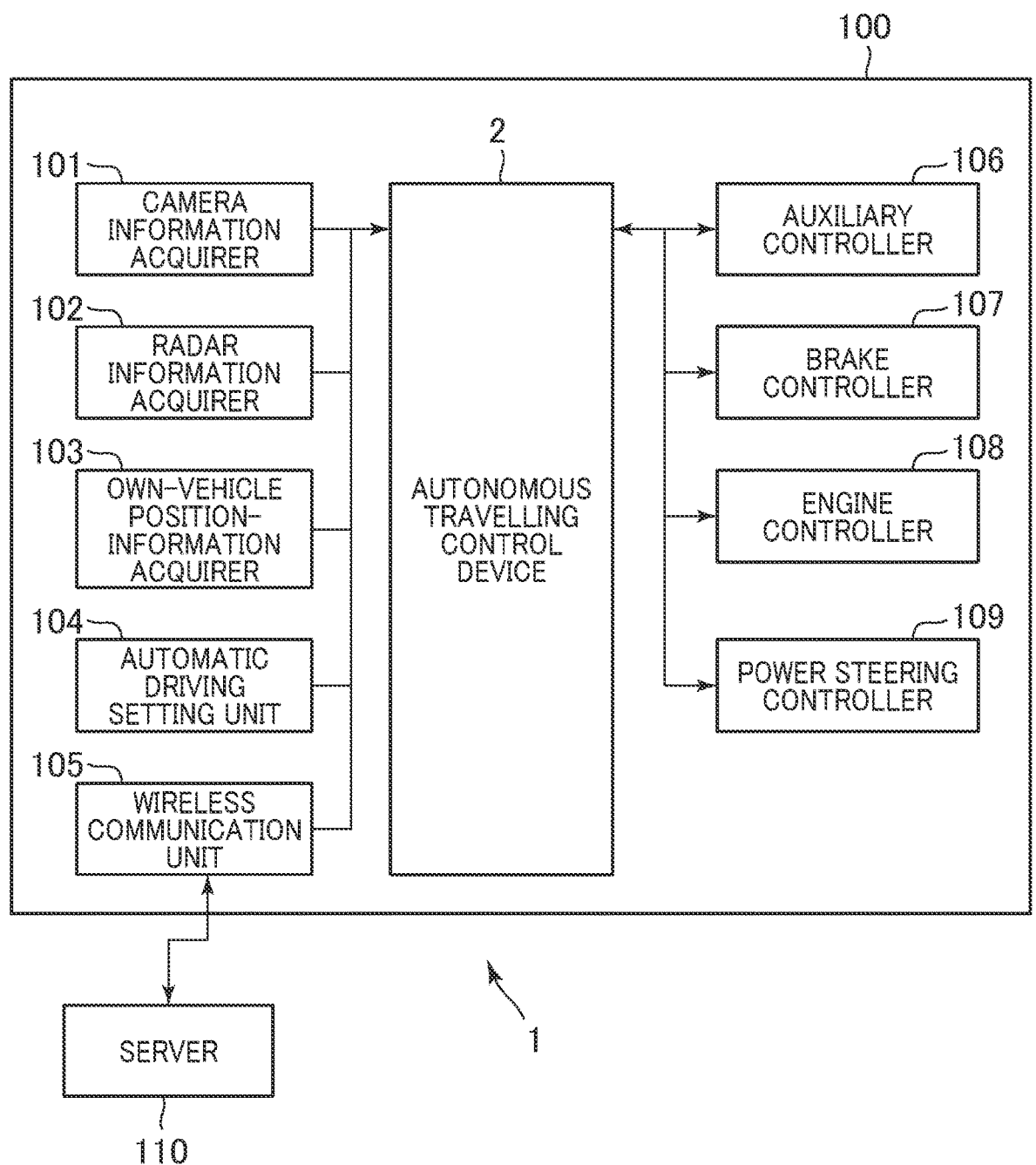
FIG. 1 is a configuration diagram of an electronic control system 1.

FIG. 1 is a configuration diagram of an electronic control system 1 according to Embodiment of the present invention. The electronic control system 1 includes a server 110 and a vehicle 100. The vehicle 100 includes a camera information acquirer 101 that acquires video information from a camera (not shown) mounted in the vehicle 100, and a radar information acquirer 102 that receives an output from a laser range finder (not shown) mounted in the vehicle 100. The vehicle 100 includes further an own-vehicle position-information acquirer 103 that receives information indicative of the position of the vehicle 100 from a global positioning system receiver (not shown) for example, a receiver supporting the GPS, and an automatic driving setting unit 104 that sets automatic driving to the vehicle 100.

The electronic control system 1 also includes a wireless communication unit 105. The wireless communication unit 105 is coupled to the server 110 via a wireless network, receives the information to be described later from the server 110, and outputs it to an autonomous travelling control device 2. That is, the wireless communication unit 105 updates the information of the electronic control system 1 by OTA (Over-The-Air).

The electronic control system 1 includes further an autonomous travelling control device 2, an auxiliary controller 106, a brake controller 107, an engine controller 108, and a power steering controller 109. The autonomous travelling control device 2, the auxiliary controller 106, the brake controller 107, the engine controller 108, and the power steering controller 109 are ECUs (Electronic Control Units), for example.

The camera information acquirer 101, the radar information acquirer 102, the own-vehicle position-information acquirer 103, the automatic driving setting unit 104, the wireless communication unit 105, the autonomous travelling control device 2, the auxiliary controller 106, the brake controller 107, the engine controller 108, and the power steering controller 109 are coupled mutually communicatively via an in-vehicle network of a CAN (Controller Area Network).

The camera information acquirer 101, the radar information acquirer 102, and the own-vehicle position-information acquirer 103 transmit the information received from respective sensors to the autonomous travelling control device 2. The automatic driving setting unit 104 transmits setting information at the case of automatic driving, such as a destination, a route, and a travelling speed, to the autonomous travelling control device 2. However, a part of information that the automatic driving setting unit 104 transmits may be received from the exterior, such as the server 110, via the wireless communication unit 105.

The autonomous travelling control device 2 performs processing for automatic driving controls and outputs a control instruction to the brake controller 107, the engine controller 108, and the power steering controller 109, based on the processing result. The auxiliary controller 106 performs the same control as the autonomous travelling control device 2 as assistance. The brake controller 107 controls the braking force of the vehicle 100. The engine controller 108 controls the driving force of the vehicle 100. The power steering controller 109 controls the steering of the vehicle 100.

When the autonomous travelling control device 2 receives a setting request of the automatic driving by the automatic driving setting unit 104, the autonomous travelling control device 2 calculates the track along which the vehicle 100 moves, based on the information on the external world from the camera information acquirer 101, the radar information acquirer 102, and the own-vehicle position-information acquirer 103. Then, the autonomous travelling control device 2 outputs control instructions, such as the braking force, the driving force, and the steering, to the brake controller 107, the engine controller 108, and the power steering controller 109, respectively, so that the vehicle 100 may be moved keeping the calculated track. The brake controller 107, the engine controller 108, and the power steering controller 109 output operation signals to actuators (not shown) as the respective control targets, in response to the control instruction from the autonomous travelling control device 2.

<Hardware Configuration of the Autonomous Travelling Control Device>

Figure 2:
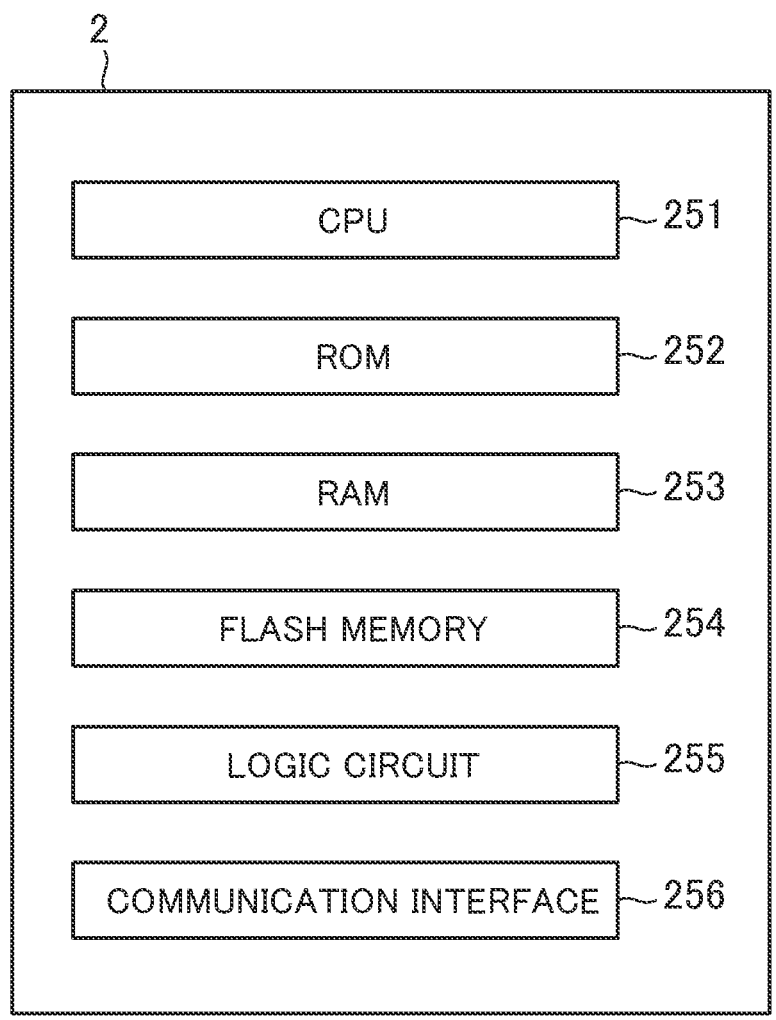
FIG. 2 is a hardware configuration diagram of an autonomous travelling control device 2.

FIG. 2 is a hardware configuration diagram of the autonomous travelling control device 2. The autonomous travelling control device 2 includes a CPU 251, a ROM 252, a RAM 253, a flash memory 254, a logic circuit 255, and a communication interface 256. The CPU 251 realizes the function to be described later by developing and executing a program stored in the ROM 252 to the RAM 253. The flash memory 254 is a nonvolatile storage area. The CPU 251 may be a processor with multiple cores that employs the lockstep method.

The logic circuit 255 is a reconfigurable logic circuit that employs a PLD (Programmable Logic Device), such as an FPGA (Field Programmable Gate Array). The logic circuit 255 can be reconfigured only in part. The communication interface 256 is an interface that communicates with predetermined protocols, such as a CAN. The autonomous travelling control device 2 is coupled to other devices via the communication interface 256, and transmits and receives data. However, the communication interface 256 may include two communication ports or a single communication port that are coupled to an external apparatus.

<Function Configuration of the Autonomous Travelling Control Device>

Figure 3:
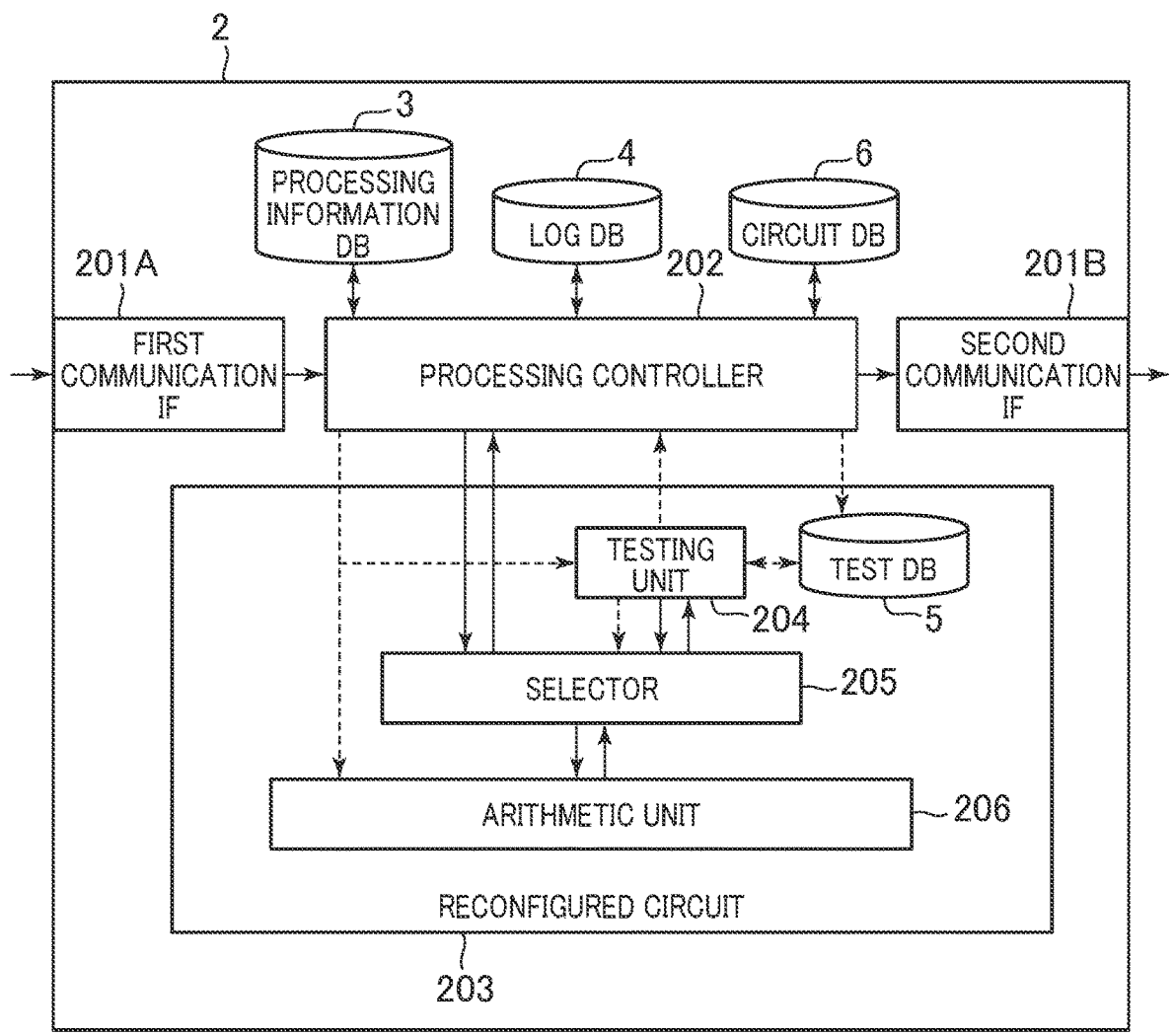
FIG. 3 is a functional configuration diagram of the autonomous travelling control device 2.

FIG. 3 is a functional configuration diagram of the autonomous travelling control device 2. The autonomous travelling control device 2 includes a first communication interface 201A, a second communication interface 201B, a processing controller 202, a reconfigured circuit 203, a testing unit 204, a selector 205, an arithmetic unit 206, a processing information database (hereinafter referred to as a processing information DB) 3, a log database (hereinafter referred to as a log DB) 4, a test database (hereinafter referred to as a test DB) 5, and a circuit database (hereinafter referred to as a circuit DB) 6. In the following, the first communication interface 201A and the second communication interface 201B are collectively called "a communication interface 201." The communication interface 201 is realized by the communication interface 256 illustrated in FIG. 2. The processing information DB 3, the log DB 4, and the circuit DB 6 are realized by the flash memory 254. The reconfigured circuit 203 is realized by the logic circuit 255. The testing unit 204, the selector 205, the arithmetic unit 206, and the test DB 5 are configured in the reconfigured circuit 203.

The autonomous travelling control device 2 is coupled to the camera information acquirer 101, the radar information acquirer 102, the own-vehicle position-information acquirer 103, the automatic driving setting unit 104, and the wireless communication unit 105, illustrated in FIG. 1, via the first communication interface 201A. The autonomous travelling control device 2 is also coupled to the auxiliary controller 106, the brake controller 107, the engine controller 108, and the power steering controller 109, via the second communication interface 201B. In FIG. 3, the autonomous travelling control device 2 includes two logical communication interfaces of the first communication interface 201A and the second communication interface 201B. However, the autonomous travelling control device 2 may include a single logical communication interface having the function of both communication interfaces.

The processing controller 202 is realized by the program executed by the CPU 251, and executes repeatedly the processing to be described later with a processing cycle T. The processing controller 202 collects periodically the sensor information from the camera information acquirer 101, the radar information acquirer 102, and the own-vehicle position-information acquirer 103, and the automatic driving setting information from the automatic driving setting unit 104. The processing controller 202 determines the number of processing times and processing information to be executed for the collected sensor information and the automatic driving setting information, with reference to the processing information DB 3. The details of the processing information DB 3 will be described later with reference to FIG. 4.

The processing controller 202 reconfigures the arithmetic unit 206, based on the number of processing times and the processing information determined with reference to the processing information DB 3. The circuit DB 6 stores processing circuit data that is written in a circuit area in the reconfigured circuit 203 to form a logic circuit such as the arithmetic unit 206.

When the arithmetic unit 206 is reconfigured, the testing unit 204 performs an operation test of the arithmetic unit 206 with reference to the test DB 5. The selector 205 is coupled to the processing controller 202, the testing unit 204, and the arithmetic unit 206, and couples an input-output of the arithmetic unit 206 to an input-output of either the processing controller 202 or the testing unit 204. During the operation test, the testing unit 204 sets up the selector 205 to couple the arithmetic unit 206 and the testing unit 204, and performs the operation test. When the operation test is completed, the testing unit 204 sets up the selector 205 to couple the arithmetic unit 206 and the processing controller 202, and at the same time, notifies the test result to the processing controller 202. The details of the test DB 5 will be described later with reference to FIG. 6.

The processing controller 202 stores the test result notified from the testing unit 204 into the log DB 4. The details of the log DB 4 will be described later with reference to FIG. 5. When the result of the operation test by the testing unit 204 is OK, the processing controller 202 makes the arithmetic unit 206 execute the arithmetic processing with the use of the sensor information for example.

The logic circuit is reconfigured by the processing circuit data determined based on the number of processing times and the processing information of the processing information DB 3, and the arithmetic unit 206 executes the predetermined processing. Based on the processing result executed by the arithmetic unit 206, the processing controller 202 outputs control instructions, such as the braking force and the driving force, via the second communication interface 201B The processing controller 202 updates the contents of the processing information DB 3, the circuit DB 6, and the test DB 5, when the updating of the processing information is received from the server 110 via the wireless communication unit 105. By the updating, it is possible to update the processing that the arithmetic unit 206 is made to execute after the next processing cycle, and the contents of the operation test that is performed when the arithmetic unit 206 is reconfigured. The example of the updating of the processing information will be described later with reference to FIG. 11.

<An Example of the Configuration of the Processing Information Database>

FIG. 4 is a drawing illustrating an example of the processing information DB 3.

The processing information DB 3 is referred to by the processing controller 202. The processing information DB 3 stores the contents of processing that the arithmetic unit 206 performs for the collected sensor information and the automatic driving setting information. The processing information DB 3 includes the fields of the number of processing times 301 and the processing information 302. The number of processing times 301 stores the number of times in which the arithmetic unit 206 performs arithmetic computations, that is, the number of times that the arithmetic unit 206 is reconfigured. The processing information 302 stores multiple pieces of the processing information (for example, the processing information 1, the processing information 2, and the processing information 3), and the circuit name of an arithmetic unit 206 corresponding to each processing and the estimated time to execute the processing concerned. The estimated time to execute the processing is a reference value for confirming the time required for the whole processing in designing; accordingly, the estimated time may not be stored in the processing information DB 3.

For example, in the example illustrated in FIG. 4, "3" is stored in the field of the number of times 301; accordingly, it is indicated that the reconfiguration of the arithmetic unit 206 and the processing by the arithmetic unit 206 are performed 3 times. From the information stored in the fields of the processing information 1, the processing information 2, and the processing information 3, indicated by symbols 302-1, 302-2, and 302-3 respectively, it is indicated that the arithmetic unit 206 is rewritten to a circuit A, a circuit B, and a circuit C. As described above, the processing information DB 3 illustrated in FIG. 4 is an example. The number of the processing information that composes the processing information 302 may be other than three. That is, the processing information 302 may be composed of two pieces of the processing information, or may be composed of four or more pieces of the processing information.

<An Example of the Configuration of the Log Database>

FIG. 5 is a drawing illustrating an example of a log DB 4. The log DB 4 stores the test result notified from the testing unit 204 by the processing controller 202. The log DB 4 is composed of multiple records, each record including fields of a processing time 401, a circuit type 402, a test result 403, and a processing state 404. The field of the processing time 401 stores the time of day when the reconfiguration processing of the logic circuit is performed in the time information that the autonomous travelling control device 2 manages internally. The field of the circuit type 402 stores the information indicative of the logic circuit of the reconfigured arithmetic unit 206. The field of the test result 403 stores the test result of the arithmetic unit 206 notified from the testing unit 204. The field of the processing state 404 stores the processing state of the autonomous travelling control device 2 that the processing controller 202 determines in response to the information of the test result 403.

For example, the first record illustrated in FIG. 5 indicates that when the processing time 401 is aa:aa:aa, the arithmetic unit 206 is reconfigured to a logic circuit A as the circuit type 402, the test result 403 is OK, and the processing state 404 is normal. The second record illustrated in FIG. 5 indicates that when the processing time 401 is bb:bb:bb, the arithmetic unit 206 is reconfigured to a logic circuit B as the circuit type 402, the test result 403 is NG, and the processing state 404 is retry. Here, the state of retry is the state in which, in the process of the processing controller 202 performing the automatic driving processing periodically, when time to reconfigure again is ensured, the same reconfiguration processing is performed in order to continue the automatic driving processing. The details will be described later with reference to FIG. 7.

The third record illustrated in FIG. 5 indicates that when the processing time 401 is cc:cc:cc, the arithmetic unit 206 is reconfigured to a logic circuit B as the circuit type 402, the test result 403 is OK, and the processing state 404 is normal. That is, it is indicated that the automatic driving processing has become possible to continue by the retry in the second record.

The fourth record illustrated in FIG. 5 indicates that when the processing time 401 is dd:dd:dd, the arithmetic unit 206 is reconfigured to a logic circuit C as the circuit type 402, the test result 403 is OK, and the processing state 404 is normal. The fifth record illustrated in FIG. 5 indicates that when the processing time 401 is ee:ee:ee, the arithmetic unit 206 is reconfigured to a logic circuit A as the circuit type 402, the test result 403 is NG, and the processing state 404 is abnormal. In other words, it is indicated that in the process of the processing controller 202 performing the automatic driving processing periodically, time to reconfigure again cannot be ensured and abnormalities occur in the automatic driving processing. Here, the information of the log DB 4 illustrated in FIG. 5 may be transmitted by the processing controller 202 to the server 110 via the wireless communication unit 105.

<An Example of the Configuration of the Test DB>

FIG. 6 is a drawing illustrating an example of the test DB 5. The test DB 5 stores multiple combinations of the circuit type 501 and the examination contents. The examination contents are composed of the number of tests 502, a test pattern 503, and test data 504. The circuit type 501 stores the information indicative of the circuit type. The number of tests 502 stores the number of times of the operation test. The test pattern 503 stores a selection pattern of the test data 504 used for the test. The test data 504 is composed of one or more pieces of test data, for example, test data 1, test data 2, and test data 3, each storing the combinations of the data to be inputted into the arithmetic unit 206 and the data expected to be outputted from the arithmetic unit 206.

For example, the first example illustrated in FIG. 6 indicates that when the circuit type 501 is a logic circuit A, the operation test is performed 3 times as specified by the number of tests 502, and the test data 504 is selected at random as specified by the test pattern 503. In this case, the turn to use the test data 1 to the test data 3 is random, and all the test data may be used in three tests, or one of the test data may be selected at random and may be repeatedly used three times. The test data 1 referred to as a symbol 504-1 indicates that a test value A1in is inputted into the arithmetic unit 206 and that the output of the test result A1out is expected. The test data 2 referred to as a symbol 504-2 indicates that a test value A2in is inputted into the arithmetic unit 206 and that the output of the test result A2out is expected. The test data 3 referred to as a symbol 504-3 indicates that a test value A3in is inputted into the arithmetic unit 206 and that the output of the test result A3out is expected.

The second example illustrated in FIG. 6 indicates that when the circuit type 501 is a logic circuit B, the operation test is performed once as specified by the number of tests 502, and the test data 504 is selected at random as specified by the test pattern 503. The third example illustrated in FIG. 6 indicates that when the circuit type 501 is a logic circuit C, the operation test is performed once as specified by the number of tests 502, and the test data 504 is fixed as specified by the test pattern 503.

The test DB 5 illustrated in FIG. 6 is an example. For example, the test data 504 is not restricted to three pieces, but it may be two pieces or one piece, or it may be four or more pieces. The number of tests 502 and the test pattern 503 are properly set up, according to the number of the test data 504, time T1, T2, and T3 as the estimated time required for each processing illustrated in FIG. 4, the cycle T, and the combinations of these items.

By changing the number of tests 502 according to the circuit type 501 as described above, it is possible to set the accuracy of error checking at the time of reconfiguring the circuit of the arithmetic unit 206, depending on the circuit type 501. By setting the test pattern 503 as "random", the test data 504 is selected at random even if the number of tests 502 is 1 for example; accordingly, it is possible to prevent only some circuits from being checked each time, and it is possible to further improve the reliability of the test. Here, the test pattern is not restricted to "fixed" only and "random" only. For example, not by selecting one from multiple pieces of the test data 504 at random each time, multiple pieces of the test data 504 may be executed with a rotation system in the predetermined turn. It is also possible not to perform the test in a specific circuit type 501, setting the number of tests 502 to 0.

<An Example of the Flow Chart of the Periodic Processing>

Figure 7:
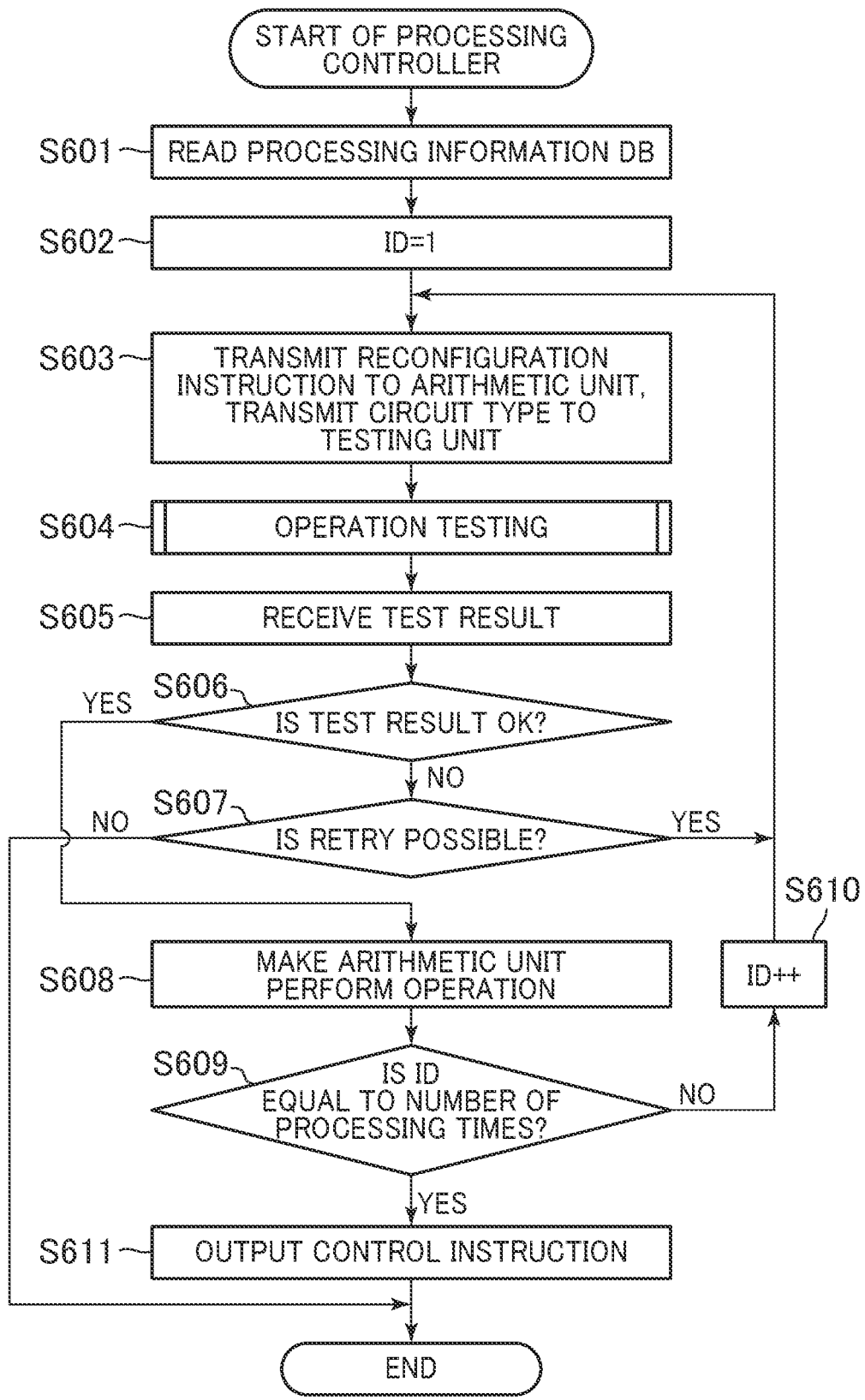
FIG. 7 is a flow chart illustrating periodic processing in a processing controller 202.

FIG. 7 is a flow chart illustrating periodic processing in the processing controller 202. In automatic driving, it is required to repeatedly perform various kinds of processing such as sensing processing, distance calculation processing, movement prediction processing of the vehicle 100 or a pedestrian, and moving route calculation processing of the vehicle 100. Therefore, the processing controller 202 performs periodically the processing illustrated in FIG. 7, based on the collected sensor information and the automatic driving setting information. Hereinafter, the processing operation of the processing controller 202 is explained with reference to the flow chart illustrated in FIG. 7.

The processing controller 202 starts the periodic processing illustrated in FIG. 7 at every processing cycle T. The execution subject of each step explained in the following is the CPU 251. When the CPU 251 starts the processing, the CPU 251 reads the number of processing times 301 and the processing information 302 from the processing information DB 3 (S601). In the following, the processing described in the processing information DB 3 is sequentially executed.

Next, the processing controller 202 sets as 1 the internal processing ID that is a loop counter provided so that the processing information 302 read at Step S601 may be processed in turn (S602).

Next, the processing controller 202 transmits a reconfiguration instruction to the arithmetic unit 206 and transmits a circuit type to the testing unit 204 (S603). Specifically, the processing controller 202 writes into the arithmetic unit 206 the circuit information of one of the processing information specified by the internal processing ID among the processing information 302, and notifies the circuit type information to the testing unit 204. Next, the processing controller 202 makes the testing unit 204 perform an operation testing (S604). The details of the operation testing in the testing unit 204 will be described later with reference to FIG. 8.

Next, the processing controller 202 receives a test result from the testing unit 204, and writes it in the log DB 4 (S605). However, at the present step, only the processing time, the circuit type, and the test result of the log DB 4 are written. At Step S606, the processing controller 202 determines whether the test result is OK. When it is determined that the test result is OK, the processing controller 202 records "normal" in the field of the processing state of the log DB 4, and advances to Step S608. When it is determined that the test result is not OK, the processing controller 202 advances to Step S607. At Step S607, the processing controller 202 determines whether retry is possible.

Whether retry is possible or not is determined based on the elapsed time up to the present in the processing cycle T and the estimated time required for executing the processing that has not been completed in the current processing cycle, for example. When it is determined that the retry is possible, the processing controller 202 records "retry" in the field of the processing state of the log DB 4, and returns to Step S603. When it is determined that the retry is impossible, the processing controller 202 records "abnormal" in the field of the processing state of the log DB 4, and terminates the processing in the current processing cycle. When it is determined that the retry is impossible, the processing controller 202 may terminate the periodic processing, after outputting, from the second communication interface 201B, the control instructions such as the braking force and the driving force for stopping safely in the event of an emergency.

At Step S608, the processing controller 202 transmits the sensor data and others corresponding to the internal processing ID to the arithmetic unit 206 and makes the arithmetic unit 206 execute operation. For example, when the internal processing ID is "1" and the circuit A corresponding to the processing information 1 is a circuit to perform the image processing, the processing controller 202 transmits image data to the arithmetic unit 206. At Step S609, it is determined whether the internal processing ID is equal to the value of the number of processing times 301 read at Step S601. When it is determined that both are equal, the flow advances to Step S611, and when it is determined that both are not equal, the flow advances to Step S610. At Step S610, the internal processing ID is incremented, that is, the value of the internal processing ID is incremented by 1 and the flow returns to Step S603. At Step S611, the processing controller 202 outputs the control instruction such as the braking force and the driving force, from the second communication interface 201B, and terminates the periodic processing.

<A Flow Chart of the Operation Testing>

Figure 8:
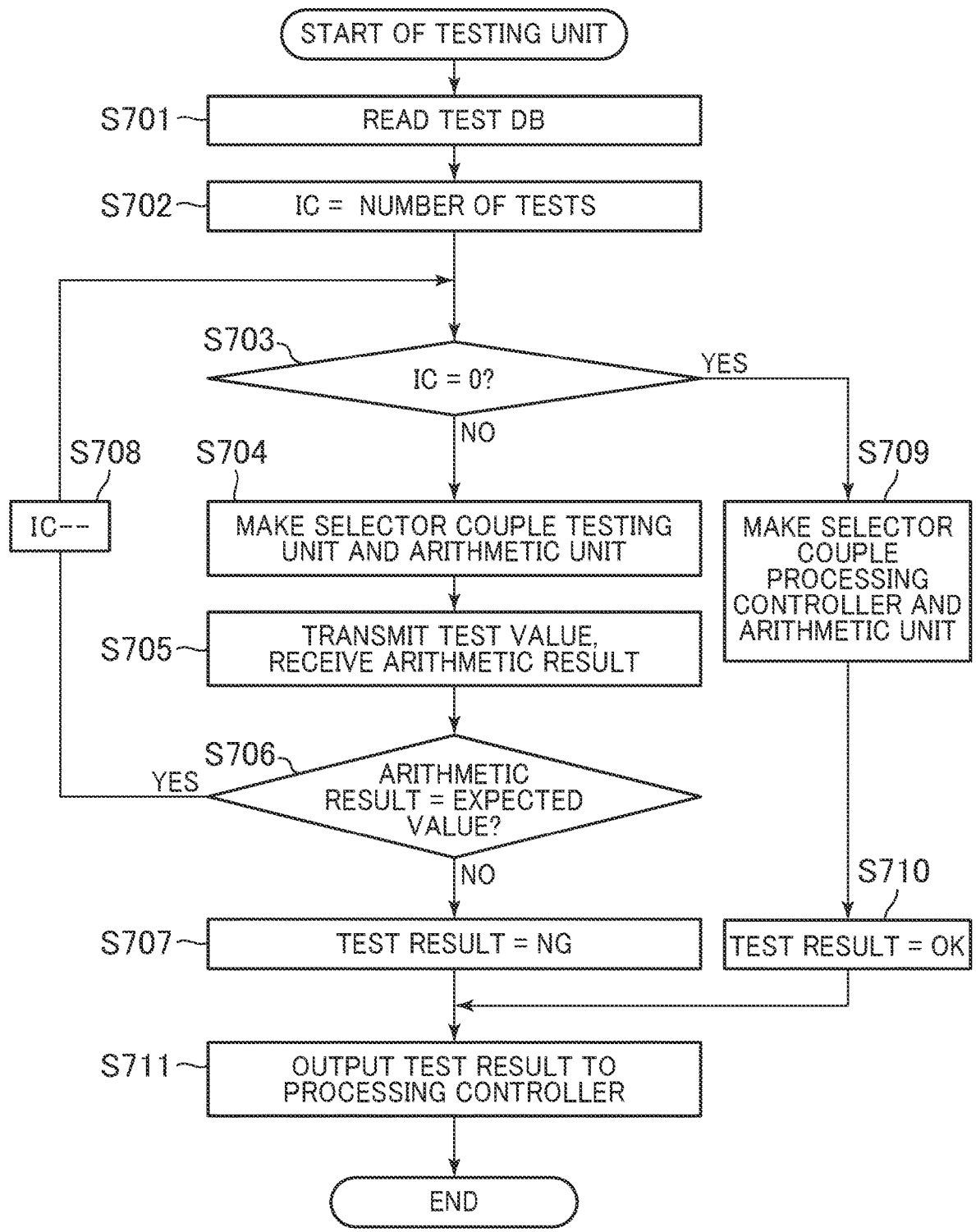
FIG. 8 is a flow chart illustrating operation testing in a testing unit 204.

FIG. 8 is a flow chart illustrating the operation testing in the testing unit 204. The testing unit 204 executes this operation testing at Step S604 of the periodic processing of the processing controller 202 illustrated in FIG. 7.

When the operation testing starts, the testing unit 204 reads the test DB 5 (S701). Specifically, based on the information of the circuit type 501 received from the processing controller 202, the number of tests 502, the test pattern 503, and the test data 504 are acquired. Next, the testing unit 204 substitutes the value of the number of tests 502 read at Step S701 into the internal processing counter IC, and advances to Step S703.

At Step S703, the testing unit 204 determines whether the internal processing counter IC is zero (0). When it is determined that the internal processing counter IC is zero (0), the flow advances to Step S709, and when it is determined that the internal processing counter IC is not zero (0), the flow advances to Step S704. At Step S704, the testing unit 204 makes the selector 205 couple the input-output of the testing unit 204 and the arithmetic unit 206. At Step S705, the testing unit 204 transmits the test value of the pertinent test data out of the test data 504 to the arithmetic unit 206, based on the test pattern 503 acquired at Step S701, and acquires the arithmetic result of the arithmetic unit 206.

At Step S706, the testing unit 204 determines whether the arithmetic result acquired at Step S705 is the same as the expected value of the corresponding test data. When it is determined that the arithmetic result is different from the expected value, the testing unit 204 advances to Step S707, and when it is determined that the arithmetic result is the same as the expected value, the testing unit 204 advances to Step S708. At Step S707, the testing unit 204 stores the test result as NG that indicates failure. At Step S708, the internal processing counter IC is decremented, that is the value of the IC is decremented by 1, and the flow returns to Step S703. At Step S709 that is executed when the affirmative determination is made at Step S703, the testing unit 204 makes the selector 205 couple the input-output of the processing controller 202 and the arithmetic unit 206. At Step S710, the testing unit 204 stores the test result as OK that indicates success.

When Step S707 or Step S710 is executed, the testing unit 204 outputs the test result to the processing controller 202 at Step S711 and terminates the operation test illustrated in FIG. 8.

<An Operation Example of the Autonomous Travelling Control Device>

An example of the operation of the autonomous travelling control device 2, that is, an example of the updating of the reconfigured circuit 203, is explained with reference to FIG. 9 and FIG. 10.

Figure 9:
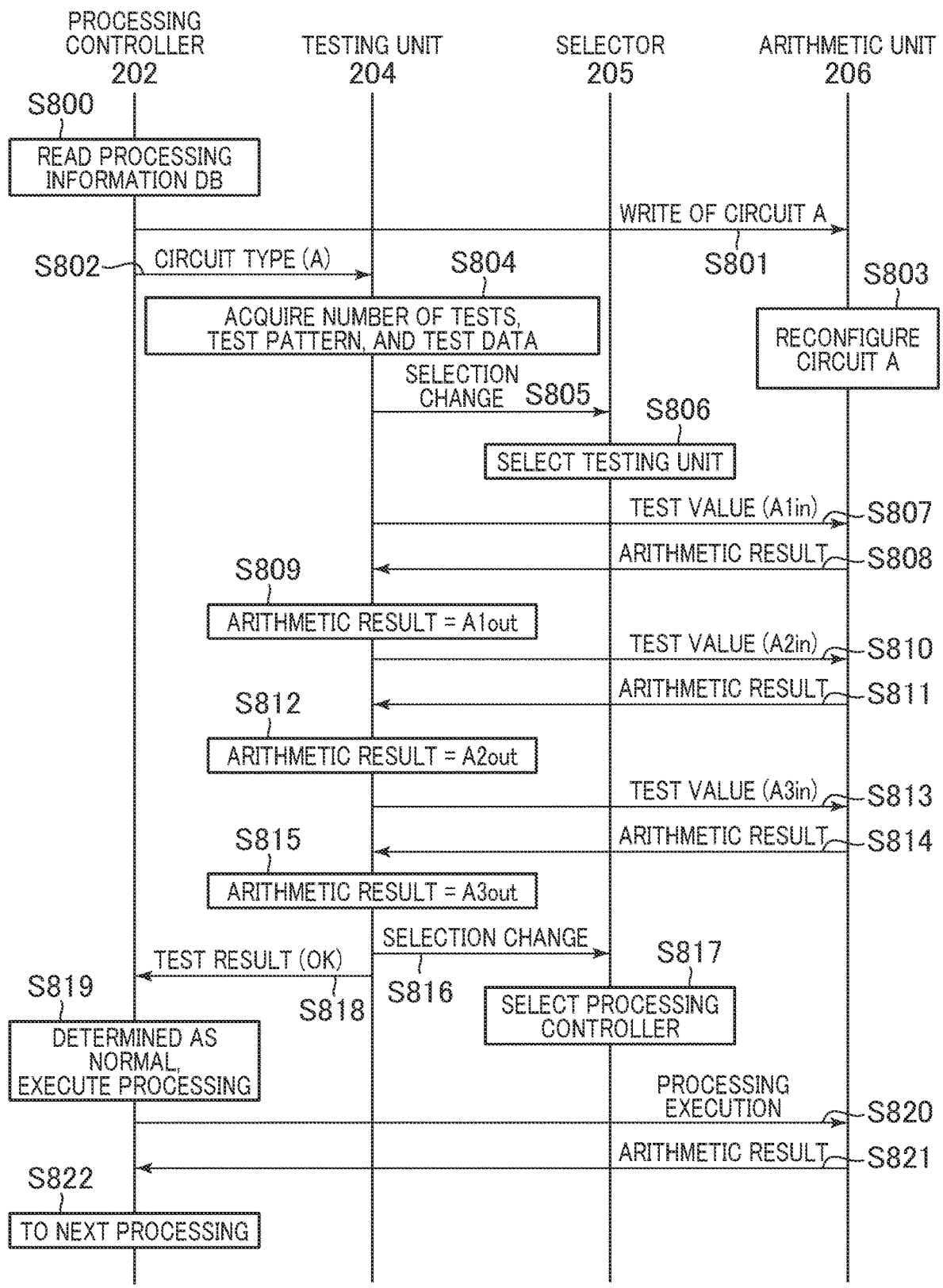
FIG. 9 is a drawing illustrating an operation example of the autonomous travelling control device 2.

FIG. 9 illustrates an example of the updating of the reconfigured circuit 203 according to the processing information 1 indicated by the symbol 302-1 illustrated in FIG. 4. Specifically, it is an example of the updating in the case where the circuit A, that is the processing circuit data of the processing information 1 of the processing information DB 3 in FIG. 4, is written in the arithmetic unit 206, the circuit type 501 of the test DB 5 in FIG. 6 performs the operation test of the logic circuit A, and the test result is OK. That is, the example shown is for the log result when the processing time 401 is aa:aa:aa in the log DB 4 illustrated in FIG. 5.

First, the processing controller 202 reads the number of processing times 301 and the processing information 302 from the processing information DB 3 (S800). Next, the processing controller 202 writes the processing circuit data of the logic circuit A specified by the processing information 1 indicated by the symbol 302-1 into the arithmetic unit 206 in the reconfigured circuit 203 (S801). The arithmetic unit 206 is reconfigured as the logic circuit A in the logic circuit (S803). In the course of the write, the arithmetic unit 206 may notify the state of being under reconfiguration of the logic circuit to the processing controller 202 or the testing unit 204. The arithmetic unit 206 may notify the completion of the write to the processing controller 202 and the testing unit 204.

Next, the processing controller 202 notifies the circuit type information of the logic circuit A specified by the processing information 1 to the testing unit 204 (S802). The testing unit 204 acquires the number of tests 502, the test pattern 503, and the test data 504 that are specified on the basis of the circuit type 501 (S804). Next, the testing unit 204 sets up the selector 205 to couple the input-output of the testing unit 204 and the arithmetic unit 206 (S805). The selector 205 couples the input-output of the testing unit 204 and the arithmetic unit 206, based on the setup of the testing unit 204 (S806).

Next, the testing unit 204 performs the operation test based on the method specified by the test pattern 503. Here, the explanation is continued assuming that the test data 1, the test data 2, and the test data 3 are selected sequentially, as the result of selecting the test data 504 at random. The testing unit 204 outputs a test value A1in to the arithmetic unit 206 as the first test (S807), and acquires an arithmetic result from the arithmetic unit 206 (S808). Here, the arithmetic result is as expected and the testing unit 204 determines that the arithmetic result coincides with the expected result A1out (S809).

Next, the testing unit 204 outputs a test value A2in to the arithmetic unit 206 as the second test (S810), and acquires an arithmetic result from the arithmetic unit 206 (S811). Here, the arithmetic result is as expected and the testing unit 204 determines that the arithmetic result coincides with the expected result A2out (S812). Next, the testing unit 204 outputs a test value A3in to the arithmetic unit 206 as the third test (S813), and acquires an arithmetic result from the arithmetic unit 206 (S814). Here, the arithmetic result is as expected and the testing unit 204 determines that the arithmetic result coincides with the expected result A3out (S815).

Next, as three tests have been completed, the testing unit 204 sets up the selector 205 to couple the input-output of the processing controller 202 and the arithmetic unit 206 (S816). The selector 205 couples the input-output of the processing controller 202 and the arithmetic unit 206 based on the setup of the testing unit 204 (S817). The testing unit 204 notifies to the processing controller 202 that the test result is OK (S818).

Next, the processing controller 202 determines that the processing state is normal, and makes the arithmetic unit 206 configured in the logic circuit A execute the processing (S819). The processing controller 202 outputs the processing information to be executed by the arithmetic unit 206 (S820), and acquires an arithmetic result from the arithmetic unit 206 (S821). As the processing of the logic circuit A specified by the processing information 1 has been completed, the processing controller 202 shifts to the next processing, that is, the processing of the logic circuit B specified by the processing information 2 (S822). The above is explanation of the transition diagram illustrating in FIG. 9.

Figure 10:
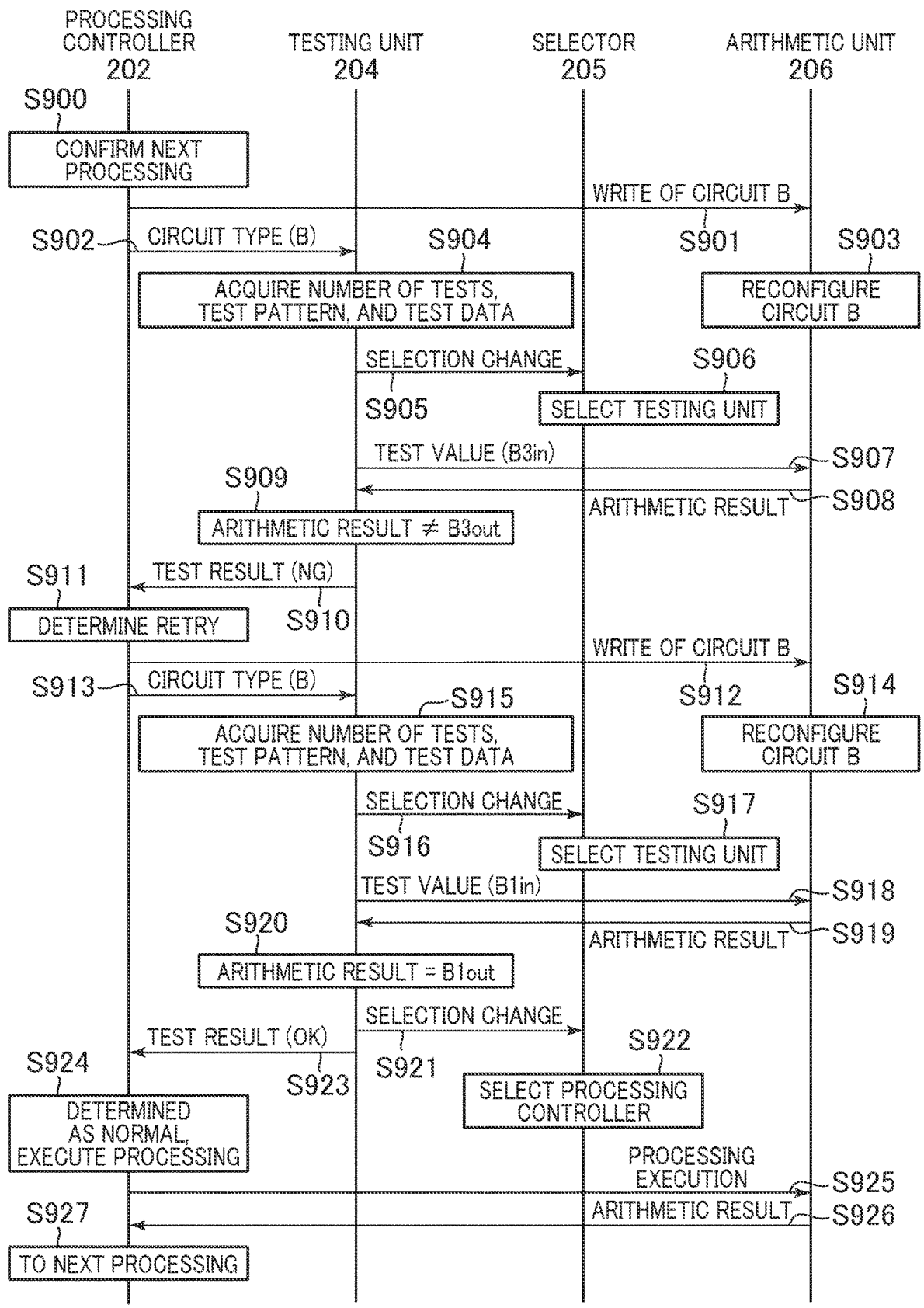
FIG. 10 is a drawing illustrating an operation example of the autonomous travelling control device 2.

FIG. 10 illustrates an example of the updating of the reconfigured circuit 203 according to the processing information 2 indicated by the symbol 302-2. Specifically, it is a sequence diagram illustrating an example of the case where the circuit B, that is the processing circuit data of the processing information 2 of the processing information DB 3 in FIG. 4, is written in the arithmetic unit 206 and the circuit type 501 of the test DB 5 in FIG. 6 performs the operation test of the logic circuit B, and where the updating of the reconfigured circuit is retried after the first operation test result is NG and the second operation test result is OK. That is, the example shown is for the log result in the case where the processing time 401 is bb:bb:bb and the processing time 401 is cc:cc:cc in the log DB 4 illustrated in FIG. 5.

The number of processing times 301 and the processing information 302 have already been determined from the processing information DB 3 in FIG. 9; accordingly, in FIG. 10, the processing controller 202 confirms first that the next processing is the processing information 2 (S900). Next, the processing controller 202 writes the processing circuit data of the logic circuit B specified by the processing information 2 into the arithmetic unit 206 in the reconfigured circuit 203 (S901). The arithmetic unit 206 reconfigures the logic circuit B in a logical circuit region (S903). In addition, the processing controller 202 notifies the circuit type information of the logic circuit B specified by the processing information 2 to the testing unit 204 (S902). The testing unit 204 acquires the number of tests 502, the test pattern 503, and the test data 504 that are specified on the basis of the circuit type 501 (S904).

Next, the testing unit 204 sets up the selector 205 to couple the input-output of the testing unit 204 and the arithmetic unit 206 (S905). The selector 205 couples the input-output of the testing unit 204 and the arithmetic unit 206, based on the setup of the testing unit 204 (S906). Next, the testing unit 204 performs the operation test based on the method specified by the test pattern 503. Here, the explanation is continued assuming that the test data 3 is selected, as the result of selecting the test data 504 at random. The testing unit 204 outputs the test value B3in to the arithmetic unit 206 (S907), and acquires the arithmetic result from the arithmetic unit 206 (S908). Here, the arithmetic result is not as expected and the testing unit 204 determines that the arithmetic result does not coincide with the expected result B3out (S909).

Next, the testing unit 204 notifies to the processing controller 202 that the test result is NG (S910). Here, the processing controller 202 determines that the retry is possible, and performs the reconfiguration processing of the logic circuit B again, and determines the continuation of the automatic driving processing (S911). The processing controller 202 writes again the processing circuit data of the logic circuit B to the arithmetic unit 206 (S912), and the arithmetic unit 206 reconfigures the logic circuit B in the logical circuit region (S914).

Also, the processing controller 202 notifies the circuit type information of the logic circuit B specified by the processing information 2 to the testing unit 204 (S913). The testing unit 204 acquires the number of tests 502, the test pattern 503, and the test data 504 that are specified on the basis of the circuit type 501 (S915).

Next, the testing unit 204 sets up the selector 205 to couple the input-output of the testing unit 204 and the arithmetic unit 206 (S916). The selector 205 couples the input-output of the testing unit 204 and the arithmetic unit 206, based on the setup of the testing unit 204 (S917). Next, the testing unit 204 performs the operation test based on the method specified by the test pattern 503. Here, an example in which the test data 1 is selected as a result of selecting the test data 504 at random is shown. The testing unit 204 outputs the test value B1in to the arithmetic unit 206 (S918), and acquires an arithmetic result from the arithmetic unit 206 (S919). Here, the arithmetic result is as expected and the testing unit 204 determines that the arithmetic result coincides with the expected result B1out (S920).

Next, as one test as specified by the number of times stored in the number of tests 502 has been completed, the testing unit 204 sets up the selector 205 to couple the input-output of the processing controller 202 and the arithmetic unit 206 (S921). The selector 205 couples the input-output of the processing controller 202 and the arithmetic unit 206 based on the setup of the testing unit 204 (S922). The testing unit 204 notifies to the processing controller 202 that the test result is OK (S923). Next, the processing controller 202 determines that the processing state is normal, and makes the arithmetic unit 206 configured in the logic circuit B execute the processing (S924). The processing controller 202 outputs the processing information to be executed by the arithmetic unit 206 (S925), and acquires an arithmetic result from the arithmetic unit 206 (S926).

Next, as the processing of the logic circuit B specified by the processing information 2 has been completed, the processing controller 202 shifts to the processing of the logic circuit C specified by the processing information 3 indicated by the symbol 302-3 (S927). The above is explanation of the transition diagram illustrating in FIG. 10.

<The Information Reception Sequence from the Server to the Autonomous Travelling Control Device>

Figure 11:
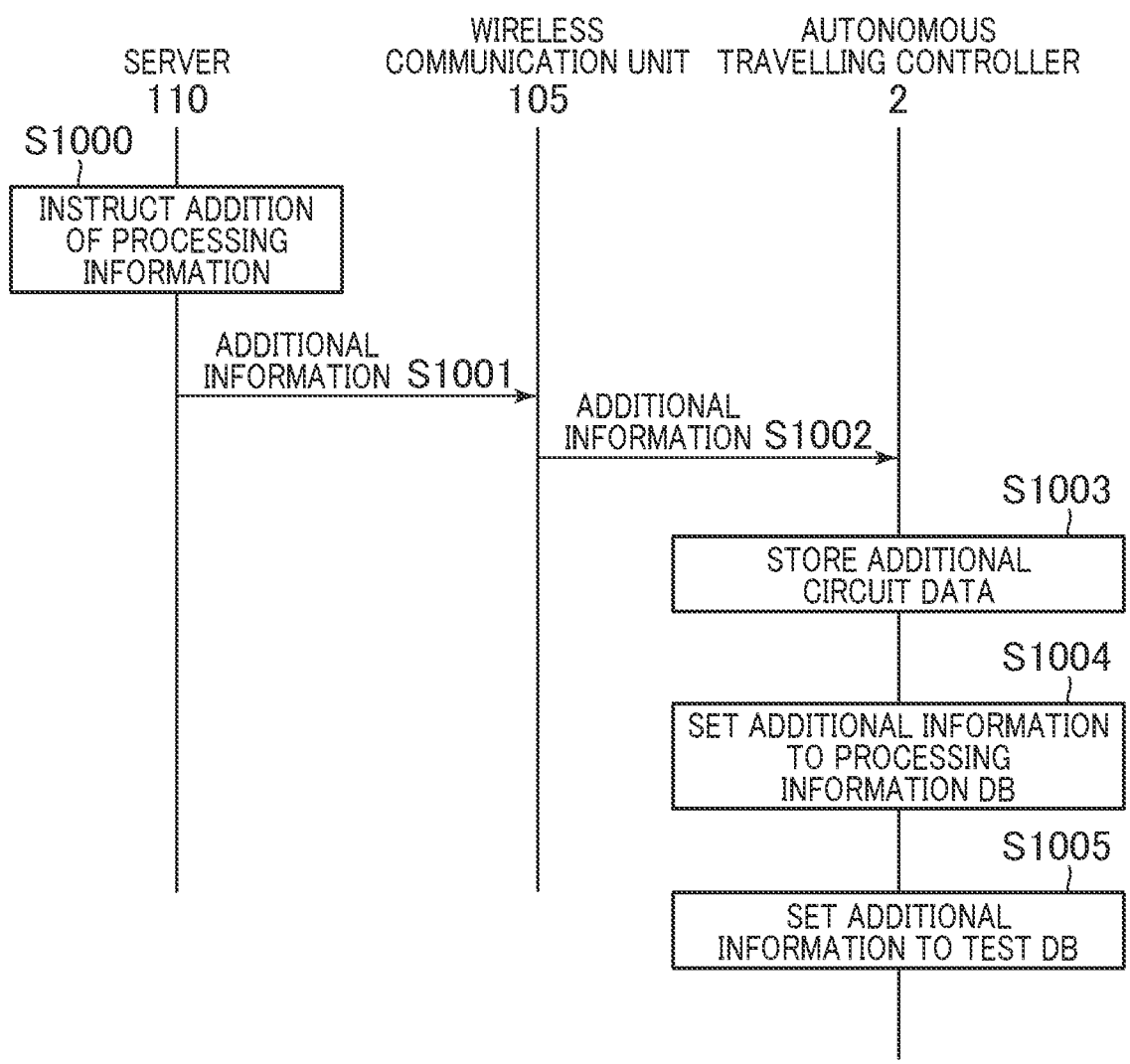
FIG. 11 is a sequence diagram illustrating the information reception from a server 110 to the autonomous travelling control device 2.

FIG. 11 is a sequence diagram illustrating the information reception from the server 110 to the autonomous travelling control device 2. FIG. 11 illustrates an example in which the processing information regarding the automatic driving is added from a server, etc. on cloud via a wireless network by OTA.

First, when an instruction to add the processing information is set to the server 110 by operation input by an operator (S1000), information regarding the automatic driving processing to be added, such as the contents of the processing information DB 3, the processing circuit data to be used in the processing to be added, and the contents of the test DB 5, are transmitted to the wireless communication unit 105 of the electronic control system 1 (S1001). The wireless communication unit 105 transfers the received additional information to the autonomous travelling control device 2 (S1002).

The processing controller 202 of the autonomous travelling control device 2 stores in the circuit DB 6 the processing circuit data received from the wireless communication unit 105 (S1003), and adds the number of processing times 301 and the processing information 302 that have been received to the processing information DB 3 (S1004). The processing controller 202 rewrites the test DB 5 based on the received information, that is, the processing controller 202 reconfigures the area corresponding to the test DB 5 of the reconfigured circuit 203 (S1005). The rewrite of the test DB 5 may not be performed immediately after receiving the information from the wireless communication unit 105; however, the test DB 5 may be reconfigured concurrently when the arithmetic unit 206 is reconfigured next time, for example.

According to First Embodiment described above, the following operation-effects are obtained.

(1) The configuration includes the logic circuit 255 that is reconfigurable based on the reconfiguration instruction; the arithmetic unit 206 configured in the logic circuit 255; the processing controller 202; and the testing unit 204. The processing controller 202 transmits the reconfiguration instruction of the arithmetic unit 206 to the logic circuit 255 and makes the reconfigured arithmetic unit 206 execute a predetermined operation. The testing unit 204 executes the operation test after modification of the circuit configuration and transmits the result of the operation test to the processing controller 202 as a notice. The processing controller 202 makes the arithmetic unit 206 execute predetermined processing based on the notice received from the testing unit 204. Therefore, it is possible to execute the operation test and to confirm the normality of the reconfigured arithmetic unit 206 whenever the arithmetic unit 206 is reconfigured.

(2) The processing controller 202 transmits the reconfiguration instruction again when the notice received is NG indicative of the failure of the operation test (NO at Step S606, Step S603 in FIG. 7). The processing controller 202 makes the arithmetic unit 206 execute the predetermined processing when the notice received indicates the success of the operation test (YES at Step S606, Step S608 in FIG. 7). The processing controller 202 executes the predetermined processing employing the sensor information, etc., only when the operation test is successful. Therefore, it is possible to prevent the sensor information from being processed using the logic circuit 255 having such an error that does not pass the operation test. It is also possible to redo reconfiguration instructions when the operation test is not successful.

(3) The testing unit 204 is configured in the logic circuit 255. Therefore, the testing unit 204 can execute the operation test at high speed.

(4) The reconfiguration instruction to be transmitted by the processing controller 202 includes the circuit information of the arithmetic unit 206 to be reconfigured. The testing unit 204 executes the operation test according to the circuit information. Therefore, the testing unit 204 can execute the optimal operation test according to the characteristic of the circuit.

(5) In the logic circuit 255, the test DB 5 is configured to store the combination of the data to be inputted into the arithmetic unit 206 and the data expected to be outputted from the arithmetic unit 206, for every circuit information. The testing unit 204 performs the operation test using the information stored in the test DB 5. The information that the testing unit 204 employs for the operation test (for example, the test value A1in, the test result A1out, etc. illustrated in FIG. 6) is held in the same logic circuit 255 as the arithmetic unit 206. Therefore, it is possible to perform the operation test at high speed. The testing unit 204 can determine the result of the operation test easily on the basis of whether the output of the arithmetic unit 206 coincides with the prepared data expected to be outputted.

(6) The test DB 5 stores multiple combinations of the data to be inputted into the arithmetic unit 206 and the data expected to be outputted from the arithmetic unit 206 for every circuit information. In the example illustrated in FIG. 6, the test DB 5 stores the combination of A1in and A1out, the combination of A2in and A2out, and the combination of A3in and A3out for the circuit A. Therefore, it is possible to perform the operation test with multiple variations; accordingly, it is possible to test the arithmetic unit 206 from various viewpoints.

(7) The test DB 5 stores the number of execution in combination for every circuit information. Based on the circuit information, the testing unit 204 repeats the random selection of one of the combinations and the execution of the operation test for the number of execution. Therefore, even when the same circuit is reconfigured, it is possible to perform the operation test using different random data.

(8) The autonomous travelling control device 2 includes the log DB 4 that stores the result of the operation test. The processing controller 202 stores the result of the operation test in the log DB 4.

(9) The autonomous travelling control device 2 includes the circuit DB 6 that stores the circuit information. The autonomous travelling control device 2 makes the circuit DB 6 store the circuit information received from the server 110 via the wireless communication unit, and reconfigures the arithmetic unit 206 using the circuit information stored in the circuit DB 6. Therefore, using the new circuit information received from the server 110, the autonomous travelling control device 2 can rewrite the logic circuit 255 to function as the arithmetic unit 206.

(10) The control method of the autonomous travelling controller 2 that includes the logic circuit 255 reconfigurable based on the reconfiguration instruction and the communication interface 256 receiving the sensor information acquired from the coupled sensor every processing cycle T, includes the steps of: reconfiguring the arithmetic unit 206 in the logic circuit 255 at least once at every processing cycle T; executing the operation test of the arithmetic unit 206 when the arithmetic unit 206 is reconfigured; and making the reconfigured arithmetic unit 206 execute the predetermined processing employing the sensor information based on the result of the operation test.

Modified Example 1

According to Embodiment described above, the data employed for the operation test of multiple circuits are stored in the reconfigured circuit 203 as the test DB 5. However, only the information of a single test may be stored in the reconfigured circuit 203.

Figure 12:
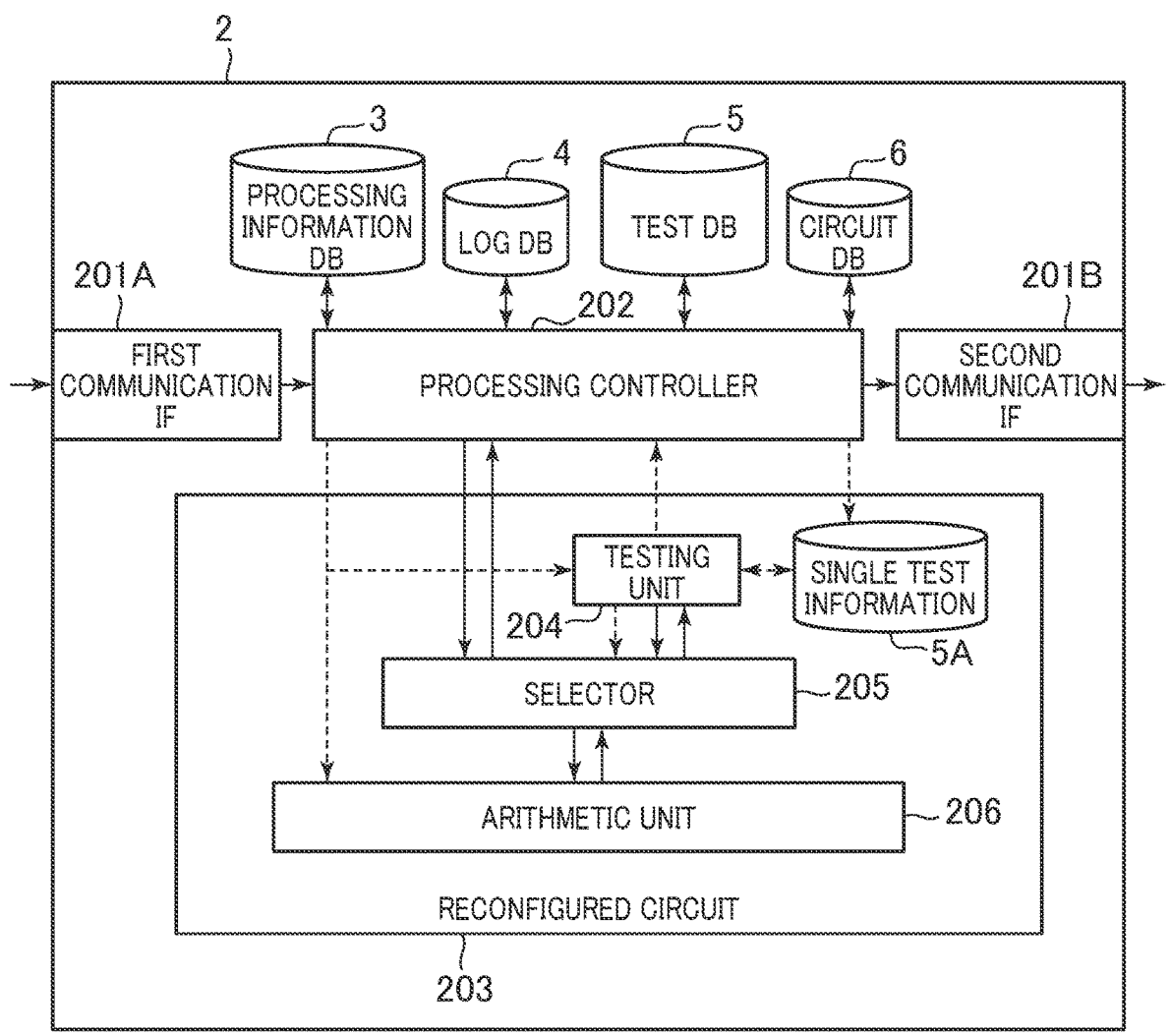
FIG. 12 is a functional configuration diagram of an autonomous travelling control device 2 according to Modified Example 1.

FIG. 12 is a functional configuration diagram of an autonomous travelling control device 2 according to Modified Example 1. When compared with FIG. 3 in Embodiment described above, the difference is in that the test DB 5 exists in the external of the reconfigured circuit 203 and single test information 5A is stored in the reconfigured circuit 203. The data employed for the operation test of the current arithmetic unit 206 is stored in the single test information 5A. For example, when the arithmetic unit 206 is rewritten to the circuit A, the data employed for the operation test of the circuit A is written in the single test information 5A. That is, in the present Modified Example, when reading the circuit data from the circuit DB 6 in order to reconfigure the arithmetic unit 206, the processing controller 202 reads the data of the operation test corresponding to the circuit from the test DB 5, and outputs the data to the reconfigured circuit 203 to reconfigure the logic circuit.

According to Modified Example 1, it is possible to reduce the exclusive-use area of the test DB 5 in the logic circuit 255, compared with Embodiment described above. Therefore, it is possible to realize the same function as in Embodiment described above using the smaller logic circuit 255. Otherwise, when the same logic circuit 255 as in Embodiment described above is employed, it is possible to increase the size of the test data 504 employed for one circuit or to increase the size of the arithmetic unit 206.

Modified Example 2

The arithmetic unit 206 should just be included at least in the reconfigured circuit 203, and the testing unit 204, the selector 205, and the test DB 5 may be configured in the external of the reconfigured circuit 203.

Figure 13:
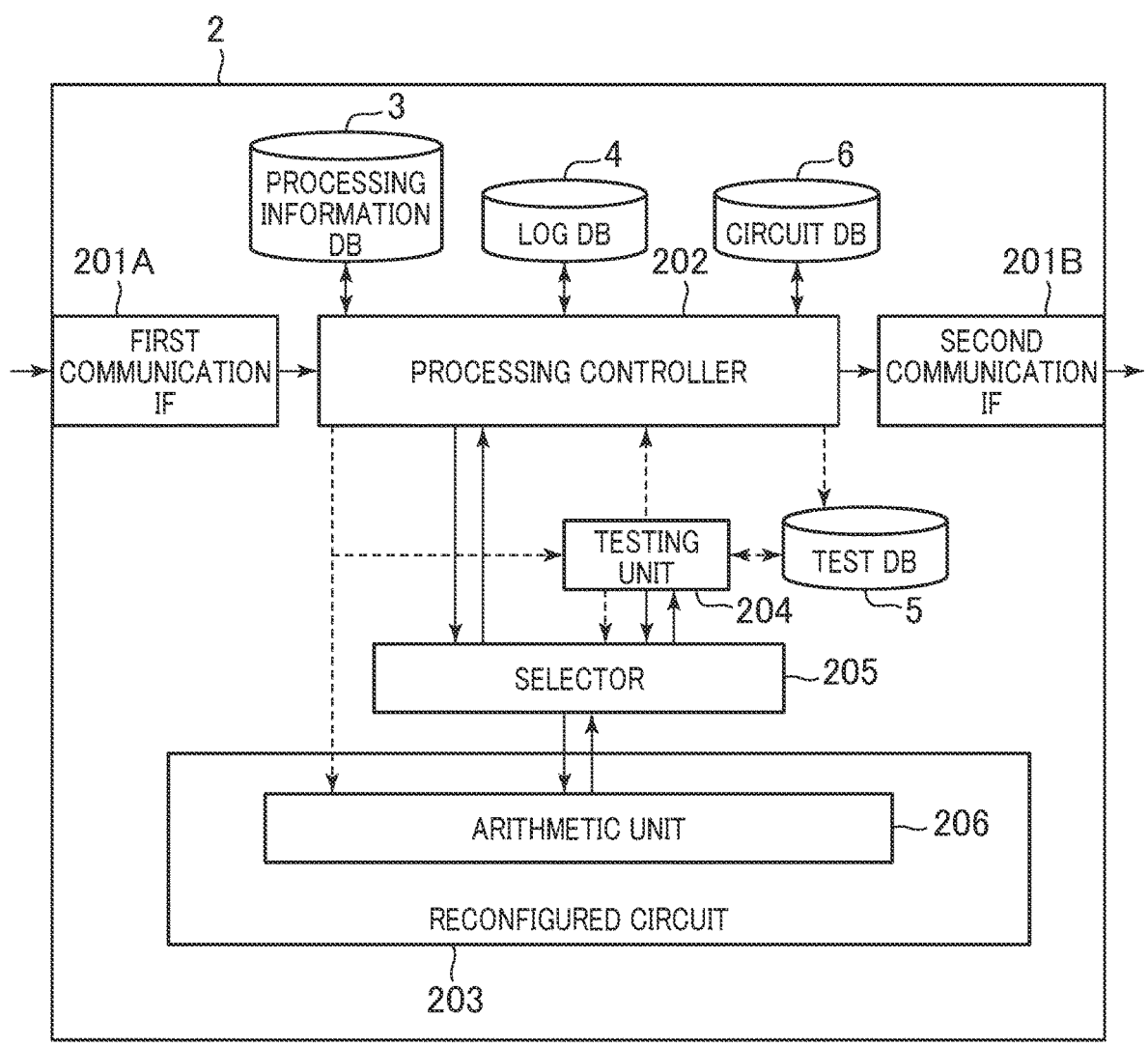
FIG. 13 is a functional configuration diagram of an autonomous travelling control device 2 according to Modified Example 2.

FIG. 13 is a functional configuration diagram of an autonomous travelling control device 2 according to Modified Example 2. When compared with FIG. 3 in Embodiment described above, the difference is in that only the arithmetic unit 206 is configured in the reconfigured circuit 203. That is, the testing unit 204 and the selector 205 are functions that are realized when the CPU 251 executes a program like the processing controller 202. That is, in the present Modified Example, it can be considered that the testing unit 204 and the selector 205 are configured in the CPU 251 that is a circuit different from the logic circuit 255.

According to Modified Example 2, the size of the testing unit 204 and the test DB 5 is not affected by the restriction of the size of the logic circuit 255. Therefore, it is possible to perform the complicated operation test using a vast quantity of data. It is also possible to expand the area in the logic circuit 255 that is available for use by the arithmetic unit 206.

Modified Example 3

The processing controller 202 may also be configured in the reconfigured circuit 203.

Figure 14:
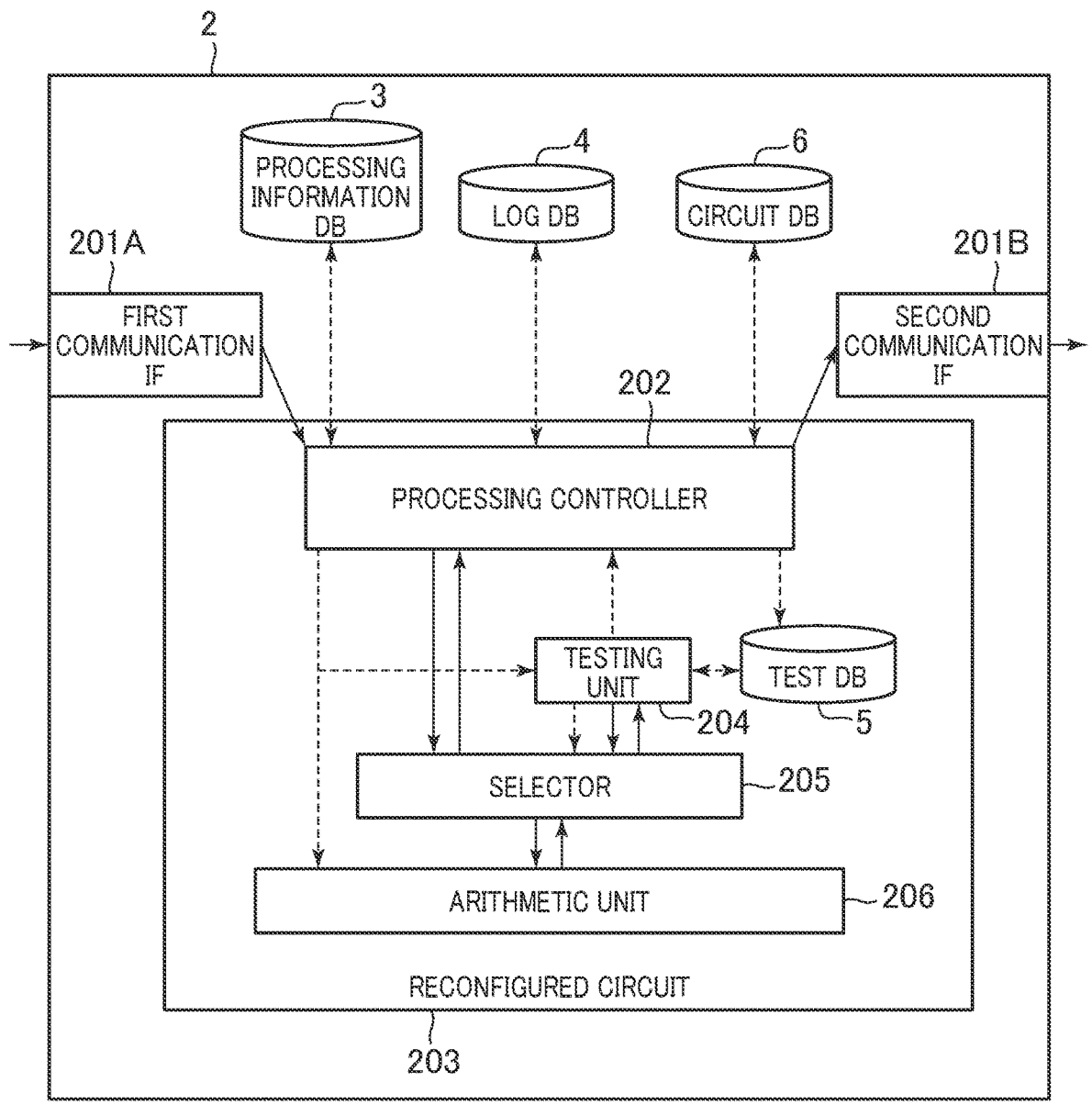
FIG. 14 is a functional configuration diagram of an autonomous travelling control device 2 according to Modified Example 3.

FIG. 14 is a functional configuration diagram of an autonomous travelling control device 2 according to Modified Example 3. When compared with FIG. 3 in Embodiment described above, the difference is in that the processing controller 202 is also configured in the reconfigured circuit 203. In the present Modified Example, the processing information DB 3 and the circuit DB 6 may also be configured in the reconfigured circuit 203. According to Modified Example 3, the autonomous travelling control device 2 does not need to include the CPU 251; accordingly, it is possible to realize the autonomous travelling control device 2 at very low cost.

Modified Example 4

The autonomous travelling control device 2 may be configured with multiple devices logically or physically. The processing controller 202 may operate on a virtual electronic controller built on the resources of multiple processing units.

It is presupposed that the program that operates the processing controller 202 is stored in the ROM 252; however, the program may be stored in the flash memory 254. The autonomous travelling control device 2 may include the input/output interface (not shown), and when necessary, the program may be read from other devices via the medium available for use by the input/output interface and the autonomous travelling control device 2. Here, the medium means a storage medium removable to the input/output interface, or a communication medium for example, that is, it means a network, such as a wired network, a wireless network, and an optical network, or a carrier and a digital signal that propagate the network concerned. Some or all of the function that is realized by the program may be realized by hardware circuitry. The Embodiment and the Modified Examples described above may be combined, respectively. In the above, various Embodiments and Modified Examples are explained. However, the present invention is not restricted to these contents. Other illustrative embodiments that are considerable within the range of the technical idea of the present invention are also included within the range of the present invention.

The disclosure of the following basic application for claiming priority is incorporated herein by reference in its entirety.

Japan patent application, 2017, No. 63644 (filed on Mar. 28, 2017)

LIST OF REFERENCE SINGS

1—Electronic control system
2—Autonomous travelling control device

3—Vehicle
4—Log database
5—Test database
6—Circuit database
105—Wireless communication unit
110—Server
201—Communication interface
202—Processing controller
203—Reconfigured circuit
204—Testing unit
205—Selector
206—Arithmetic unit
255—Logic circuit

The invention claimed is:

1. An electronic controller comprising:
a logic circuit that is reconfigurable based on a reconfiguration instruction;
an arithmetic unit configured in the logic circuit;
a processing controller that transmits a reconfiguration instruction of the arithmetic unit to the logic circuit and that makes the reconfigured arithmetic unit execute a predetermined operation; and
a testing unit that executes an operation test for the arithmetic unit when the arithmetic unit is reconfigured and that transmits the result of the operation test to the processing controller as a notice,
wherein the processing controller makes the arithmetic unit execute the predetermined processing based on the notice received from the testing unit.

2. The electronic controller according to claim 1,
wherein, when the notice received indicates failure of the operation test, the processing controller transmits the reconfiguration instruction again, and when the notice received indicates success of the operation test, the processing controller makes the arithmetic unit execute the predetermined processing.

3. The electronic controller according to claim 1, further comprising:
a selector that is coupled to the arithmetic unit and that switches an input-output of the arithmetic unit to any of the processing controller and the testing unit,
wherein, when the arithmetic unit is reconfigured, the testing unit couples the input-output to the testing unit, and when the operation test is completed, the testing unit couples the input-output to the processing controller.

4. The electronic controller according to claim 3,
wherein the testing unit is configured in the logic circuit.

5. The electronic controller according to claim 4,
wherein the processing controller is configured in the logic circuit.

6. The electronic controller according to claim 1,
wherein the testing unit is configured in a circuit different from the logic circuit and coupled to the logic circuit.

7. The electronic controller according to claim 1,
wherein the reconfiguration instruction to be transmitted by the processing controller includes circuit information of the arithmetic unit to be reconfigured, and
wherein the testing unit executes the operation test corresponding to the circuit information.

8. The electronic controller according to claim 7,
wherein, in the logic circuit, a test information storage unit is further configured to store the combination of the data to be inputted into the arithmetic unit and the data expected to be outputted from the arithmetic unit for the every circuit information, and
wherein the testing unit performs the operation test by employing the information stored in the test information storage unit.

9. The electronic controller according to claim 8,
wherein the test information storage unit stores a plurality of combinations of the data to be inputted into the arithmetic unit and the data expected to be outputted from the arithmetic unit for the every circuit information.

10. The electronic controller according to claim 9,
wherein the test information storage unit stores further the number of execution in combination for the every circuit information, and
wherein, based on the circuit information, the testing unit repeats the random selection of one of the combinations and the execution of the operation test, for the number of execution.

11. The electronic controller according to claim 1 further comprising:
a log database that stores the result of the operation test,
wherein the processing controller stores the result of the operation test in the log database.

12. An electronic control system comprising:
an electronic controller according to claim 7;
a communication unit that is wire-coupled to the electronic controller; and
a server that performs wireless communicates with the communication unit,
wherein the electronic controller further comprises a circuit memory unit that stores the circuit information, and
wherein the electronic controller makes the circuit memory unit store the circuit information received from the server via the communication unit, and transmits the circuit information stored in the circuit memory unit to the logic circuit.

13. A control method of an electronic controller provided with a logic circuit that is reconfigurable based on a reconfiguration instruction and a communication interface that receives sensor information acquired by a coupled sensor for every processing cycle, the control method comprising the steps of:
reconfiguring an arithmetic unit in the logic circuit at least once for the every processing cycle;
executing an operation test of the arithmetic unit when the arithmetic unit is reconfigured; and
making the reconfigured arithmetic unit execute a predetermined processing by employing the sensor information, based on the result of the operation test.

* * * * *